METHOD OF MANUFACTURING A THERMOELECTRIC ASSEMBLY
Filed Oct. 12, 1961 2 Sheets-Sheet 1
FIG. 1
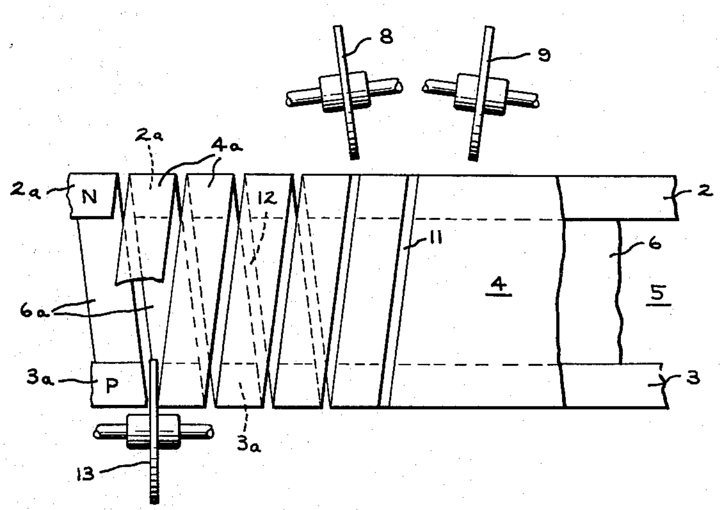
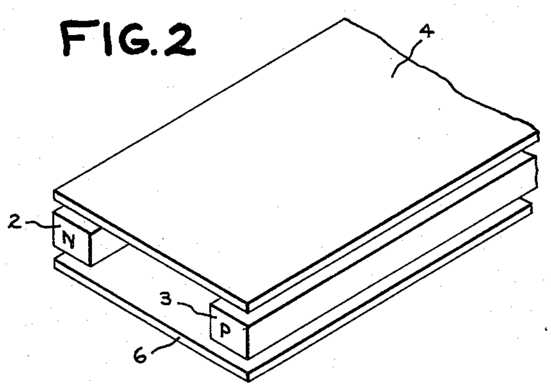
FIG. 3
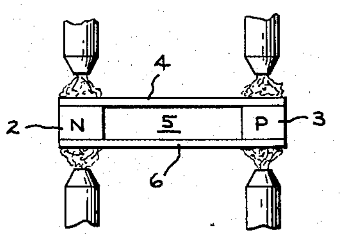
FIG. 4
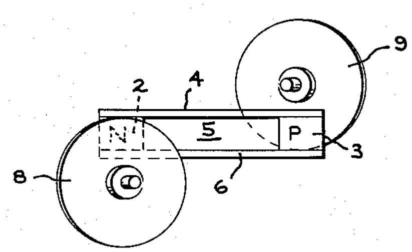
INVENTOR.
JOSEPH A. PIETSCH
BY [signature]
HIS ATTORNEY

METHOD OF MANUFACTURING A THERMOELECTRIC ASSEMBLY

Filed Oct. 12, 1961 2 Sheets-Sheet 2

INVENTOR.
JOSEPH A. PIETSCH
BY [signature]
HIS ATTORNEY 3,126,616
Patented Mar. 31, 1964

3,126,616

METHOD OF MANUFACTURING A THERMOELECTRIC ASSEMBLY

Joseph A. Pietsch, Louisville, Ky., assignor to General Electric Company, a corporation of New York Filed Oct. 12, 1961, Ser. No. 144,695
1 Claim. (Cl. 29—155.5)

The present invention relates to thermoelectric assemblies of the type used in heating and cooling devices and more particularly to an improved structural arrangement for thermoelectric members and their associated conductors and to the manufacture of this improved structural arrangement.

When two materials having dissimilar thermoelectric properties are joined and a direct current is passed therethrough, the junction becomes either hot or cold depending upon the direction of the electrical current flowing through the junction. This phenomenon is known as the Peltier effect and exists in all junctions of dissimilar materials to some extent. Some materials or alloys, due to a combination of thermal and electrical properties, produce an effect that is many times the magnitude of others and these materials or alloys are called thermoelectric materials. For example, thermal junctions formed between certain alloys of lead, bismuth, or antimony combined in varying quantities with tellurium or selenium and having slight amounts of impurities, such as silver, gold or sulphur, have exhibited heating and cooling properties of a magnitude that can be usefully applied in the fields of air conditioning and refrigeration.

A thermoelectric heating or cooling device, in its simplest form, comprises a source of D.C. power which forces a current through a series of junctions of dissimilar thermoelectric materials. The thermal junctions either absorb heat or generate heat and are, therefore, segregated so that all like junctions are arranged in the same ambient. The cold junctions then produce a cooling effect in one ambient, while the hot junctions dissipate heat to another ambient. The thermal junctions of the device are usually formed by soldering two blocks or rods of dissimilar thermoelectric materials to a conductor link. The conductor link then, not only conducts the electric current to the respective thermoelectric members, but also acts as a heat exchange surface to aid the transfer of heat to and from the thermal junction. Thus, the structure of the thermoelectric assembly not only plays an important part in its method of manufacture but also is very important in connection with the particular heat transfer characteristics of the unit when considered in connection with the use to be made of the device.

In manufacturing a thermoelectric assembly, the thermoelectric materials are usually cut to size and arranged in their respective positions and then conductor links are soldered thereto to connect the individual elements in series within the assembly so that a current may be passed therethrough. The method of assembling these devices is usually very tedious and time consuming thereby making the ultimate thermoelectric unit extremely costly. It is desirable, therefore, to design the thermoelectric assembly so that it may be easily manufactured and constructed with a minimum amount of labor or hand operations to reduce as much as possible the labor costs involved in the manufacture of such a device.

It is an object of the present invention, therefore, to provide an improved thermoelectric structure for a heating and cooling device which may be easily assembled.

It is another object of the present invention to provide a method for constructing a thermoelectric device which may be easily adapted to mass production techniques.

A more specific object of the present invention is to provide a method for constructing a thermoelectric assembly in which the thermoelectric materials are formed in long bars and then cut into smaller units or members after the conductor links have been attached so that the conductor links provide structural strength to the thermoelectric material during the cutting operation.

Further objects and advantages of the invention will become apparent as the following description proceeds and the features of novelty which characterize the invention will be pointed out with particularity in the claim annexed to and forming a part of this specification.

In carrying out the present invention there is provided a thermoelectric assembly formed from a first row of P-type thermoelectric elements and a second row of N-type thermoelectric elements arranged substantially parallel to the first row. Attached to opposite sides of each element are electrical conductor strips which extend diagonally across the space between the rows of elements to connect with opposite sides of the two adjacent elements in the opposite row of elements so that each of the elements in each of the rows is electrically connected in series between two adjacent elements in the opposite row of thermoelectric elements. The above construction provides an arrangement whereby the conductor strips on one side of the thermoelectric elements all form hot junctions with the thermoelectric elements and the conductor strips on the other side of the rows of thermoelectric elements all form cold junctions whenever a direct current is passed through the series connected assembly.

As a further aspect of the present invention, the above-described thermoelectric assembly is formed by providing relatively long bars of dissimilar thermoelectric materials which are arranged substantially in parallel. A plurality of electrical and thermal conductor links are attached to opposite sides of the bars so that they extend across the space between the bars. Each conductor link is spaced a short distance from adjacent links on the same side of the thermoelectric bars and the opposite ends of each conductor link are superimposed across the parallel thermoelectric bars from the ends of two adjacent conductor links on the other side of the thermoelectric bars. The conductor bars are then severed along the space left between the adjacent conductor links to form two rows of thermoelectric elements each having connected to opposite sides thereof a pair of conductor links which connect at their other ends with the opposite sides of two adjacent elements in the opposite row of thermoelectric elements.

For a better understanding of the invention, reference may be had to the accompanying drawing in which:

FIGURE 1 is a plan view showing one method of manufacturing the thermoelectric assembly of the present invention;

FIGURE 2 is a perspective exploded view of the components used in forming the thermoelectric assembly of the present invention;

FIGURE 3 is a somewhat schematic view representing the soldering or brazing operation;

FIGURE 4 is a schematic cross-section illustrating the relative position of the cutting wheels during the manufacturing operation;

Figure 5:
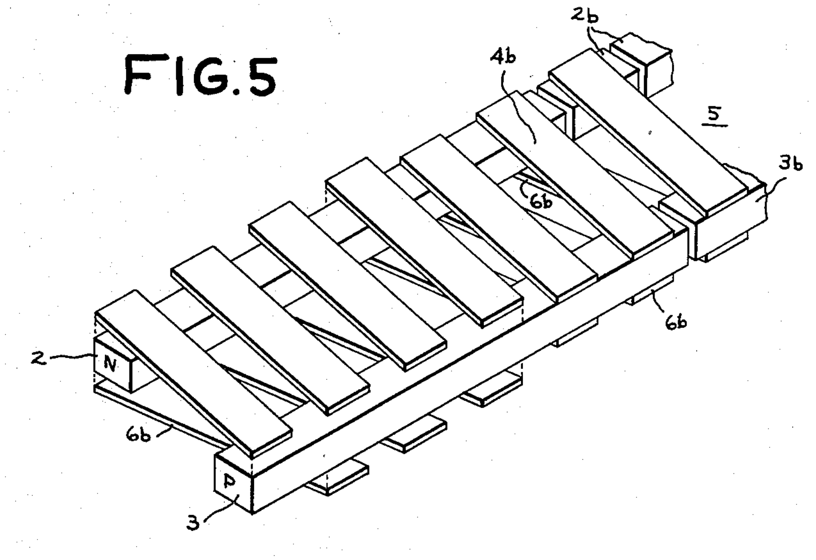
FIGURE 5 is a perspective view similar to that of FIGURE 2 illustrating a variation of the method of forming the thermoelectric assembly.

Referring now to FIGURE 1 of the drawing there is shown the thermoelectric assembly of the present invention as it is being assembled. Generally speaking, a thermoelectric heating and cooling device comprises an array of thermal junctions of series connected elements having dissimilar thermoelectric properties. In the drawings, the thermoelectric materials and elements are designated either N or P. The N and P nomenclature is prevalent in semi-conductor terminology at present and is used herein for convenience in differentiating materials having dissimilar thermoelectric properties. An N material includes an abundance of electrons. A P material includes an abundance of electron vacancies or holes. A thermocouple or thermoelectric junction is formed when an element of N type material is joined to an element of P type material.

In most cases thermoelectric materials are manufactured by processes that result in long slender bars or rods of thermoelectric material that must then be cut into smaller elements of a size desirable for use in thermopile construction. In FIGURE 1, the thermoelectric bars are denoted by the reference numerals 2 and 3 and the N and P type thermoelectric elements cut from these bars are designated 2*a* and 3*a*. It has been the practice in the past to first cut the thermoelectric bars into proper size thermoelectric elements and then to connect the elements in series through means of suitable conductor links or bars of thermally and electrically conductive material, such as copper. In the method of assembly proposed by the present invention, the thermoelectric bars are not cut into smaller thermoelectric elements until after the conductor links or conductor material has been attached. As illustrated in FIGURES 1, 2 and 3, sheets 4 and 6 of conductor material, such as copper, are attached to opposite sides of thermoelectric bars 2 and 3, which are arranged substantially parallel, with a space 5 between them. The sheets 4 and 6 extend across the space 5 between the parallel bars 2 and 3 and are firmly attached to opposite sides of the bars by a soldering or brazing operation, such as schematically shown in FIGURE 3 and which has been commonly used in this field for connecting electrical conductors to thermoelectric elements.

In order to provide a plurality of thermoelectric elements connected in series by separate conductor links, a plurality of parallel slanting cuts are made across opposite sides of the above-described soldered assembly, which comprises the parallel thermoelectric bars 2 and 3 having conductor sheets 4 and 6 attached to opposite sides thereof. As is schematically illustrated in FIGURE 1, a pair of rotary cutting wheels 8 and 9 are passed through portions of the assembly to make parallel cuts or slits 11 and 12 on the opposite sides thereof. The slits form a plurality of conductor links 4*a* and 6*a* out of the sheets 4 and 6. The parallel cuts also completely sever the bars 2 and 3 thereby forming a plurality of small thermoelectric elements 2*a* and 3*a* arranged in two parallel rows. As is illustrated schematically in FIGURE 4, the cutting wheel 9 cuts through the side 4 and clear through both bars 2 and 3 but does not cut the sheet 6. Cutting wheel 8 slits sheet 6 and both bars 2 and 3 but does not cut sheet 4.

It will be noted, upon reference to FIGURE 1, that all of the cuts 11, made by the cutting wheel 9 across the side of the assembly including the sheet 4, are made somewhat diagonally or at a slant with respect to a plane perpendicular to the sheet 4 or perpendicular to the parallel rods 2 and 3. Also, all of the cuts made by the cutting wheel 8 across the other side of the assembly are made diagonally or at a slant with respect to a perpendicular plane passing through the sheet 6 or through the bars 2 and 3. In the preferred embodiment shown in FIGURE 1, the angles of these cuts 11 and 12 are equal and diagonally opposite with respect to a plane passing perpendicularly through the parallel thermoelectric bars 2 and 3. The combined angle, or sum of these angles, is such as to subtend a chord having a width substantially equal to one conductor link at a radial distance equal to the width of the assembly, or equal to the width of the sheets 4 and 6. Thus, the angular relationship of the parallel cuts is such that the end portions of all of the cuts 11 are superimposed directly across the thermoelectric bars from the end portions of all of the cuts 12.

In this manner, the bars 2 and 3 are cut up into a plurality of elements 2*a* and 3*a*, each of which has connected on opposite sides thereof conductor links 6*a* and 4*b*. Each element in one row of elements, such as the row of elements designated 2*a* has conductor links 4*a* and 6*a* attached to opposite sides thereof and which also connect with opposite sides of two adjacent elements 3*a* in the opposite row of elements. Similarly all of the 3*a* elements are connected by conductor links 4*a* and 6*a*, extending from opposite sides thereof, which also are attached to opposite sides of two adjacent elements 2*a* in the opposite row of elements.

The resulting assembly is a series connected array of N type elements 2*a* and P type elements 3*a* through which a current may be passed to provide hot junctions on one side of the assembly and cold junctions on the other side of the assembly. Thus, if current is flowing in the direction from an N type element 2*a* through a conductor link 4*a* to a P type element 3*a* and then back to another N type element 2*a* through the conductor link 6*a*, it will be noted that the conductor links 4*a* all form the cold junction, or the N to P junctions; and the conductor links 6*a* all form the hot junctions, or the P to N junctions. If current were passed through the assembly in the opposite direction, such as from an N type element 2*a* through a conductor link 6*a* to a P type element and then to an N type element through a conductor link 4*a*, then all of the conductor links 6*a* make the N to P junction or connection and are, therefore, cold, while the conductor links 4*a* make the P to N connection and form the hot junctions of the thermoelectric assembly. In practice the space 5 is usually filled with a suitable insulating material, such as a plastic foam or other suitable insulation, which isolates the hot side of the assembly from the cold side. The assembly is then mounted so that all of the conductor links 4*a* are exposed to one ambient and all of the conductor links 6*a* are exposed to another ambient. Either of these ambients may be cooled while heat is dissipated to the other ambient merely by controlling the direction or polarity of current flow through the assembly.

It should be mentioned that, while the diagonal cuts 11 and 12 made by the cutting wheels 9 and 8 respectively, do, if properly made, completely sever the bars 2 and 3, it may be desirable to make a third cut perpendicular inwardly with respect to the bars 2 and 3 for a distance calculated to assure complete severance of the bars 2 and 3 into their respective elements 2*a* and 3*a*. A third cutting wheel 13 is shown schematically in FIGURE 1 for making such a perpendicular cut. This cut, of course, prevents the thermoelectric material of one element from short circuiting the assembly by contacting more than one conductor link on the same side of the assembly.

It should be pointed out that an advantage associated with the above-described method of forming a thermoelectric assembly is that the plates or sheets 4 and 6 provide excellent support for the cutting operation performed on the thermoelectric bars 2 and 3. The sheets 4 and 6, which are attached to the bars 2 and 3 support or "back up" the thermoelectrical material adjacent the cut and help prevent the very frangible thermoelectric material from chipping or breaking during the cutting operation.

Referring now to FIGURE 5 there is shown an exploded view illustrating another variation of the method of manufacturing the thermoelectric assembly. In this variation of the method, the conductor links 4*b* and 6*b* are first cut into narrow strips prior to soldering them to the bars 2 and 3 of thermoelectric material. The individual conductor links 4*b* and 6*b* are soldered or brazed to the parallel bars 2 and 3 so that the opposite ends of each conductor link, such as the link designated 4*b* in FIGURE 5, are superimposed across the bars from the ends of two adjacent conductor links, such as conductor links designated 6*b*, on the opposite side of the bars 2 and 3. After the links have been attached to the parallel thermoelectric bars 2 and 3, then the bars are severed in the gaps or spaces left between the adjacent superimposed ends of the conductor links 4*b* and 6*b* to provide a plurality of series connected elements 2*b* and 3*b*. As will be obvious from the above description, the method employed in FIGURE 5 differs from that illustrated in FIGURE 1 only in the prior cutting of the conductor links, which are then placed in their respective positions with respect to the thermoelectric bars 2 and 3 prior to cutting of the bars into thermoelectric elements. The previously attached conductor links support the thermoelectric elements 2*b* and 3*b* after the cuts have been made and also provide structural strength during the cutting operation.

Figure 6:
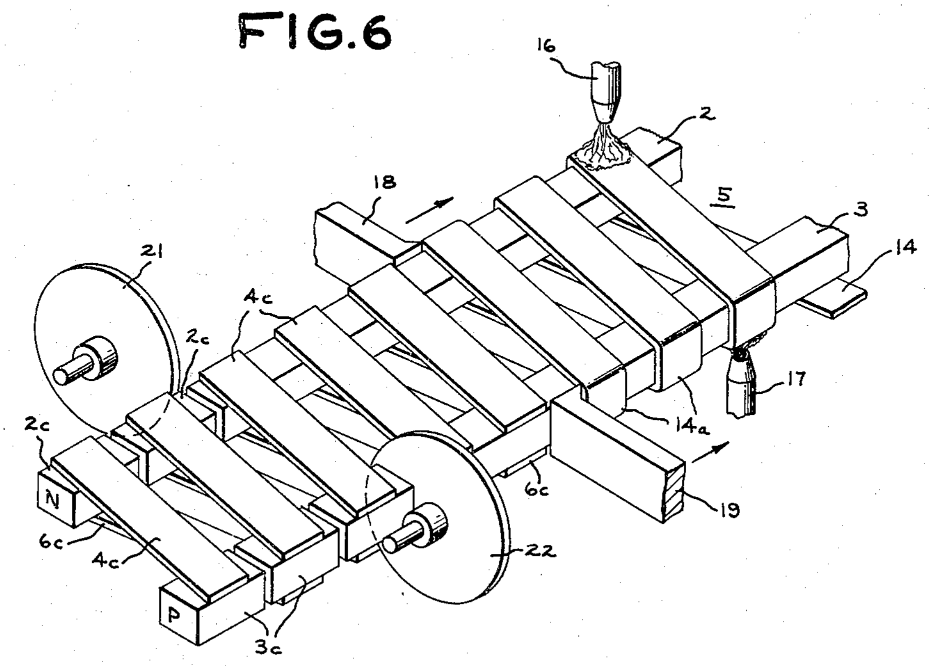
FIGURE 6 is a perspective view illustrating a third variation of the method of manufacturing the thermoelectric assembly of the present invention.

Still another variation of the method is shown in FIGURE 6. In using this method, a long, narrow strip of suitable conductor material 14, such as copper, is provided which is then helically wrapped around two bars 2 and 3 of thermoelectric material arranged in parallel relationship. As shown schematically in FIGURE 6, the helically wrapped strip 14 is then attached to opposite sides of the bars by a brazing or soldering operation. It will be understood that this operation may be performed in a furnace or in any other well known manner, instead of by means of the gas soldering devices 16 and 17 shown in FIGURE 6.

After the strip 14 is firmly attached to the thermoelectric bars 2 and 3, the unsoldered, connecting turns 14*a* are cut from the assembly. In FIGURE 6, this is performed schematically by cutting tools 18 and 19 which move parallel to the outer sides of the parallel bars 2 and 3. The tools 18 and 19 completely sever the strip 14 leaving only the conductor links 4*c* and 6*c* attached respectively to opposite sides of the bars 2 and 3 across the space 5 between the bars. Obviously the removal of the end turns 14*a* could be accomplished by means of other tools such as a rotary saw passing flush against the outer sides of the bars 2 and 3. The end result of this operation is to produce a plurality of parallel conductor links 4*c* and 6*c* attached to opposite sides of the thermoelectric bars 2 and 3. Because the original strip 14 was helically wrapped around the parallel bars 2 and 3, the conductor links are arranged so that the opposite ends of one conductor link are superimposed substantially across from the ends of two adjacent conductor links on the other side of the conductor bars 2 and 3.

As in the previously described variations of the method, the final step in performing this variation is to sever the conductor bars 2 and 3 in the area of the gap or space left between the superimposed ends of the conductor links. In FIGURE 6, this operation is shown schematically by using cutting wheels 21 and 22, which move perpendicular to the bars 2 and 3, and cut the bars into separate thermoelectric elements 2*c* and 3*c*. As in the previous arrangements the conductor links support the thermoelectric elements after assembly. While the strip 14 has been shown in FIGURE 6 to be wrapped helically leaving rather large spaces or gaps between the adjacent wraps, it will be understood that, in practice, it would be desirable to place the adjacent wraps fairly close together. The relative width of the strip 14 and the conductor links is, of course, a matter of design, but in practice it is probably desirable to cut the thermoelectric elements so that they are approximately the same width as the conductor links, as is the case in the structure of FIGURE 1.

While in accordance with the patent statutes there has been described what at present is considered to be the preferred embodiments of the invention, it will be understood by those skilled in the art that various structural and procedural changes may be made without departing from the scope of this invention, and it is, therefore, the aim of the appended claim to cover all such changes as fall within the spirit and scope of the invention.

What I claim as new and desire to secure by Letters Patent of the United States is:

In a method of making a thermoelectric assembly for a heating and cooling device utilizing the Peltier effect, the steps comprising providing a longitudinal thermoelectric bar of P-type semi-conductor material, providing a longitudinal thermoelectric bar of N-type semi-conductor material, placing said bars in substantially parallel alignment with a short space therebetween, helically wrapping a strip of electrically and thermally conductive material around said thermoelectric bars leaving a short gap between adjacent wraps of said strip of material, soldering said strip to opposite sides of each of said bars, removing the portion of each wrap of said strip deformed about the outwardly disposed sides of said bars, severing said bars along said gaps between adjacent wraps of conductive material to form two rows of relatively short thermoelectric elements each having connected to opposite sides thereof a segment of said conductor strip extending across said space between said elements thereby to form a series connected thermal assembly of alternately connected thermoelectric elements having cold junctions arranged on one side of said assembly and having hot junctions arranged on the other side of said assembly.

References Cited in the file of this patent

UNITED STATES PATENTS

| | | |
|---|---|---|
| 2,278,744 | Sparrow | Apr. 7, 1942 |
| 2,310,026 | Higley | Feb. 2, 1943 |
| 2,672,492 | Sukacev | Mar. 16, 1954 |
| 2,674,641 | Holmes | Apr. 6, 1954 |
| 2,793,420 | Johnston | May 28, 1957 |
| 2,991,627 | Suits | July 11, 1961 |
| 3,016,715 | Pietsch | Jan. 16, 1962 |

FOREIGN PATENTS

| | | |
|---|---|---|
| 811,755 | Great Britain | Apr. 8, 1959 |